United States Patent [19]

Campbell, III

[11] Patent Number: 4,705,913
[45] Date of Patent: Nov. 10, 1987

[54] AMORPHOUS SILICON DEVICES AND METHOD OF PRODUCING

[76] Inventor: William P. Campbell, III, 3310 Rowland Pl., Washington, D.C. 20008

[21] Appl. No.: 850,083

[22] Filed: Apr. 9, 1986

Related U.S. Application Data

[63] Continuation of Ser. No. 735,945, May 20, 1985, abandoned, which is a continuation of Ser. No. 593,376, Mar. 26, 1984, abandoned, which is a continuation of Ser. No. 317,512, Nov. 2, 1981, abandoned.

[51] Int. Cl.$^4$ .................... H01L 31/06; H01L 21/205
[52] U.S. Cl. .................................... 136/258; 357/30; 357/59; 427/39; 427/47; 427/74; 118/723; 437/101
[58] Field of Search ............ 136/255, 258 AM; 357/2, 357/15, 30, 59; 427/39, 47, 74, 86; 148/174; 118/50.1, 640, 715, 723-725; 29/572

[56] References Cited

U.S. PATENT DOCUMENTS 4,064,521 12/1977 Carlson .................................. 357/2
4,369,205 1/1983 Winterling et al. ................... 427/39

OTHER PUBLICATIONS

R. F. Graf, "Radio Shack Dictionary of Electronics", Tandy Corp. (1974), p. 145.

H. Watanabe et al, *Thin Solid Films*, vol. 129, pp. L65–L66 (1985).
M. A. Green, "Solar Cells", Prentice-Hall, Inc. (1982), p. 63.
M. Taniguchi et al, *J. Non-Crystalline Solids*, vols. 35–36, pp. 189–194 (1980).
T. Hamasaki et al, *Japan J. Appl. Phys.*, vol. 20 (1981), Suppl. 20-1, pp. 281–285.
K. Mori et al, *Japan J. Appl. Phys.*, vol. 20, pp. 2431–2432 (1981).
T. Hirao et al, *J. Appl. Phys.*, vol. 52, pp. 7453–7455 (1981).

Primary Examiner—Aaron Weisstuch
Attorney, Agent, or Firm—Antonelli, Terry & Wands

[57] ABSTRACT

An amorphous silicon material fabricated by a magnetically aligned glow discharge. A junction leg (e.g., electrostatic barrier) can be formed between two adjacent semiconductor layers by forming a first semiconductor layer by glow discharge deposition in the presence of a first magnetic field to form a first layer with a first orientation, and by forming a second semiconductor layer by glow discharge deposition in the presence of a second magnetic field to form a second layer with a second orientation different from the first orientation, with the barrier being formed between the two layers having different orientations.

15 Claims, 9 Drawing Figures

AMORPHOUS SILICON DEVICES AND METHOD OF PRODUCING

This application is a continuation of application Ser. No. 735,945, filed May 20, 1985, now abandoned, which is a continuation of application Ser. No. 593,376, filed Mar. 26, 1984 now abandoned, which is a continuation of application Ser. No. 317,512, filed Nov. 2, 1981, now abandoned.

BACKGROUND OF THE INVENTION

The present invention is directed towards a method for the production of low cost thin films of the amorphous silicon type.

In the world's search for a non-polluting renewable energy source, it has become apparent that silicon photovoltaic devices can play a major role if the cost for producing the cells can be reduced to a competitive level. State-of-the-art photovoltaics work well, but are energy intensive to produce and waste materials in fabrication, thus making them non-competitive when compared with conventional energy sources. Amorphous silicon cells of the photovoltaic variety, amorphous semiconductor electronic circuits, and amorphous photoreproductive films may overcome many of the problems with conventional silicon materials; however, until recently they have only remained lab experiments due to the many technical problems associated with their construction.

To date, the size of experimental amorphous cells has been extremely small due to defects and short circuits in the cell.

SUMMARY OF THE INVENTION

Amorphous silicon has many advantages as a photovoltaic material. It has a short range order of no more than 20 Å and an average density of localized states in the energy gap of $10^{17}/cm^3$. Glow discharge amorphous silicon has a drift mobility of electrons of $10^{-3} cm^2/Vsec.$ or greater. It has been estimated that an electron lifetime of $10^{-5}$ seconds is obtainable.

The apparatus herein described makes use of magnetic means to help align the silicon deposits. It has also been found that the magnet's influence greatly increases the deposition rate and helps to prevent contamination from the chamber walls. The use of magnetic means has also been found to create a novel improved junction.

Preliminary tests have shown an electric current of about $2ma/cm^2$ under tungsten illumination from a homogeneous cell material having a magnetically aligned barrier region.

DETAILED DESCRIPTION OF THE INVENTION

Figure 1:
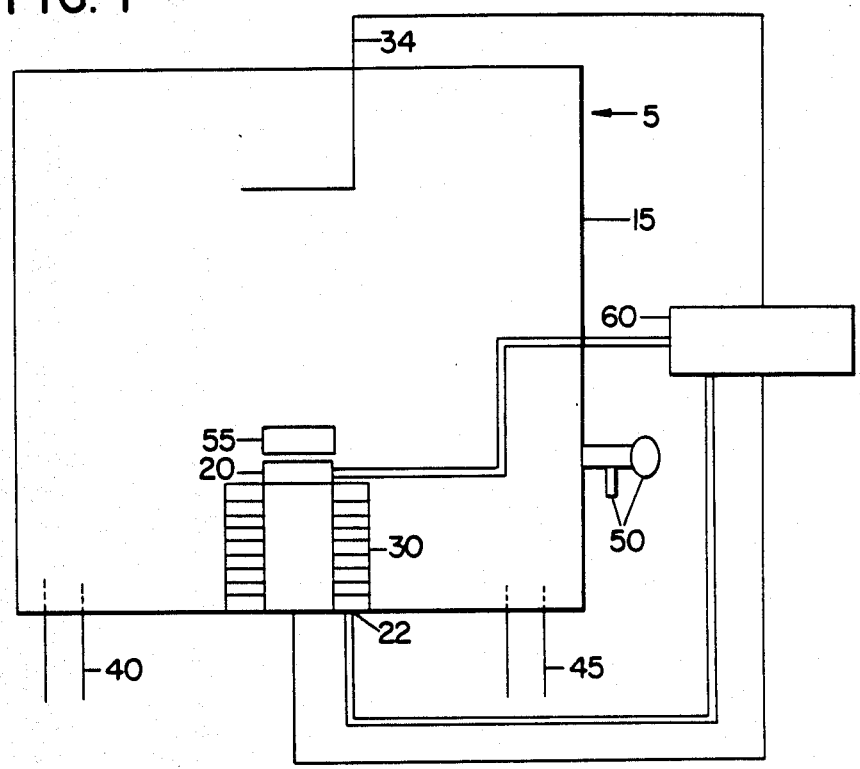
FIG. 1 is a view of a first apparatus for the production of amorphous silicon devices.

The present invention relates to a novel electronic silicon device and method for producing the same, as well as apparatus for producing same. Referring to FIG. 1, a first embodiment of an electronic silicon production device of the present invention is designated as 5.

The device 5 represents a first glow discharge apparatus suitable for the production of silicon electronic devices. The glow discharge device consists of a vacuum chamber 15 and a heating element 20. The heating element 20 is attached to a magnet core means 30. The core means 30 also serves as an electrode 22. Electrode 34 is located at a spaced distance from electrode 22, which consists of a ring coil, or screen. Outlet 40 is connected to a suitable high vacuum pump means, i.e., mechanical, diffusion, ion or cryogenic, for the evacuation of vacuum chamber 15. While the highest level of vacuum or purity in the vacuum chamber is desirable, it has been shown that a mechanical low-vacuum system can produce working cells. Inlet 45 allows for the introduction of gases to the vacuum chamber 15. Sensors 50 allow for the monitoring of pressure inside vacuum chamber 15. Such sensor means are well known to the art and usually consist of a thermocouple, hot filament or ionization type gauge. Usually two types of sensors are used together to cover the full vacuum range.

A substrate 55 is placed on heating element 20. The substrate means is comprised of electrically conducting metal, such as, for example, steel, aluminum, gold, silver, etc. It is usually advisable to coat the heating element with a layer of a material such as antimony to provide uniform heat conduction to the substrate.

A power supply 60, which can be AC, DC or RF, is connected to 34 and 22, as well as 20 and 30. The power supply is connected to heating element 20 and magnet core means 30 via wires 61 and 62, respectively. The power supply 60 is, e.g., a generalized representation of a multi-purpose power supply which energizes, e.g., the glow discharge electrodes, the heating element, the magnet, etc. If DC power is used, the electrodes can be either negative or positive. However, a greater deposition rate occurs in cathodic operation, i.e., when 22 is connected to the negative side of the power supply. In operation, it has proved desirable to reverse the polarity of the electrodes between the junction layers during the deposition process, though not necessary for operation of silicon devices. RF glow discharge of the type well known in the art is also possible. As shown schematically, power supply 60 also energizes magnet core means 30 and heating element 20.

In operation, the chamber 15 is evacuated by vacuum pump means to a pressure approximately between $10^{-2}$ to $10^{-10}$ torr. During evacuation, heating means 20 is energized, heating the substrate means to a temperature of about 100° to 500° C. After evacuation is completed, a silicon containing gas, such as for example, $SiH_4$, silane or various formulations of silicon tetrafluoride, silicon gases containing selenium, arsenic/gaseous chalcogenide glass material, or the like, is introduced into the chamber through valve 45. When a pressure of between 0.1 and 150 torr has been reached, the power supply 60 is energized along with magnetic means 30. As is clear from the orientation of the coils of magnetic means 30 in FIG. 1, the magnetic field produced by magnetic means 30 is perpendicular to the surface of the substrate 55 on which the semiconductor material layers are deposited.

When the unit is thus energized in, for example, the cathodic arrangement, electrons are freed from substrate means 55. The electrons are guided by the lines of force created by magnetic means 30, thereby striking and ionizing $SiH_4$ in an orderly formation. The $SiH_4$ thus ionized is attracted to the substrate and, in its ionized condition, is also affected by the magnetic lines of force, thus causing the $SiH_4$ molecules to be aligned on the substrate along a common vector with a common rotation. This allows for a more even deposit and decreases internal defects which cause short-circuits. When a sufficient deposit has been obtained, the polarity of the magnetic means 30 is reversed. The electrodes 22 and 34 can also be reversed in polarity simultaneously. In the present mode of operation, a second layer is deposited on the first. The second layer, however, consists of $SiH_4$ of opposite vector and reverse rotation. To complete the cell, a suitable electric conducting grid 87 is evaporated onto the surface of the cell. See FIG. 2. An anti-reflecting coating may also be applied.

Figure 2:
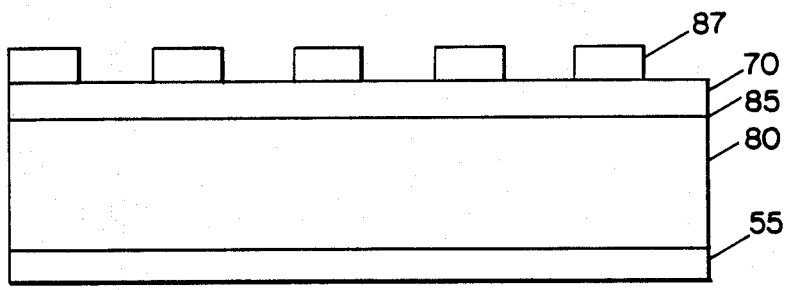
FIG. 2 is a cross-sectional view of a first embodiment of the silicon device.

Referring to FIG. 2, a cross-section of an actual cell is shown. Silicon layer 70 consists of the same material as layer 80, but is deposited with the magnet means 30 providing an opposite rotation and orientation. Due to their reverse alignment, an electro-static barrier 85 is created between the layers caused by the close proximity of the counter-rotating fields. When photon radiation impinges on layer 70, electrons are displaced. Low energy electrons are rebounded from the barrier but higher energy electrons can penetrate the boundary area 85, passing through to layer 80. This creates a polarized condition within the cell. Thus, when substrate 55 is electrically connected through a load to grid 87, useful work can be performed.

While the herein mentioned cell, utilizing silicon, functions at a high level of efficiency and has exhibited a number of other advantages, other materials, such as germanium, cadmium sulfide, cadmium telluride, indium phosphide, gallium arsenide, aluminum antimonide and other well known semiconductor materials also show promise.

While the present embodiment represents the most unique and simple method, other techniques using dopants well known to the art also have shown use with the above-mentioned method.

Figure 3:
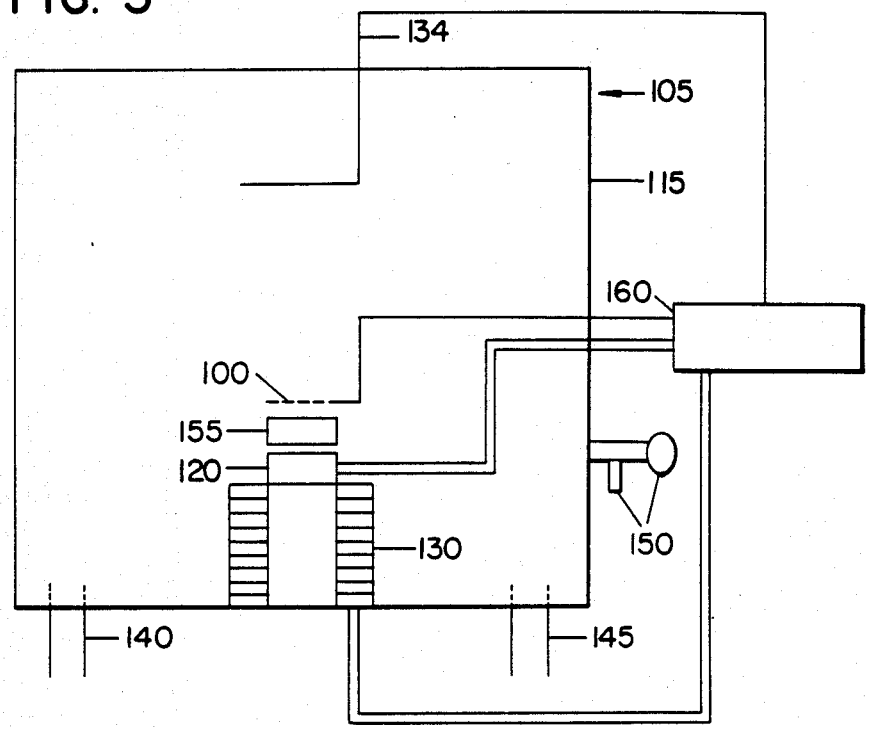
FIG. 3 is a view of a second apparatus for the production of amorphous silicon devices.

Another glow discharge apparatus is shown in FIG. 3. This apparatus is quite similar to the device shown in FIG. 1, having components corresponding to components 34, 61, 62, 5, 15, 60, 50, 45, 40, 30 and 20 of FIG. 1 (corresponding components in FIG. 3 are 134, 161, 162, 105, 115, 160, 150, 145, 140, 130 and 120, respectively). The main difference is the omission of use of the magnetic core 130 as an electrode. Instead, a screen electrode 100 is positioned over the substrate means 155. The screen electrode consists of a suitable metal mesh with a mesh smaller than the dark space region of the cathode. The electrode 100 is positioned below the electrode means 134 and at a spaced distance above the substrate means 155 approximating the cathode dark space region.

The device 105 functions differently from the device 5 in that the substrate 155 is not electrically connected to the power supply 160. In the device 105, the electric connection is made to electrode 100.

In operation, the power supplies 160 energizing the electrodes and the magnet 130 are turned on. In the cathodic operating mode, the screen electrode 100 emits electrons which are influenced by the magnetic means lines of force, thereby attracting positive ions. The positive ions generally pass through the screen electrode and are deposited on the substrate 155.

This permits the coating of substrate materials which are not conductors of electricity, although conducting materials can be coated as well. Similarly, the device 105, like the device 5, can operate in a reversed polarized mode as well, i.e., anodic.

Figure 4:
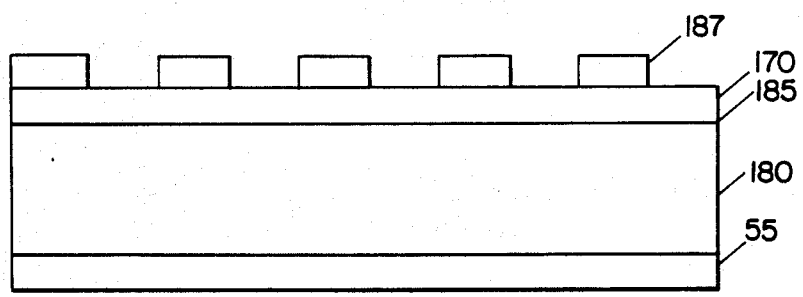
FIG. 4 is a cross-sectional view of a second embodiment of an amorphous silicon device.

In FIG. 4 is shown another cell type which is identical to the cell in FIG. 2 except that it contains dopants. In the formation of this cell, all deposition process conditions remain the same except that a dopant is added to each layer.

In fabrication of the photovoltaic device in FIG. 4, the substrate means is placed on the heating element 120. The chamber 115 is then evacuated. Silicon-containing gas is introduced, along with a dopant such as, for example, 0.1 to 10% diborane. The power supply 160 and magnetic means 130 are then energized, resulting in a deposit of P-type magnetically aligned silicon 180. The chamber 15 is again evacuated and a silicon-containing gas, including a dopant such as, for example, 0.01 to 10% phosphine, is introduced. The polarity of the magnet means 30 is reversed, as can also the electrode means be reversed. The power supply 60 is then energized, resulting in a deposit of N-type silicon 170. A grid electrode 187 is then deposited on layer 170 by a state-of-the-art evaporation procedure and apparatus.

While the above method produces a workable cell, it has been fully contemplated to apply the layers in a reverse order.

Also, while diborane and phosphine are mentioned as dopants, it is assumed that other dopant materials well known in the art can be used as well.

Figure 5:
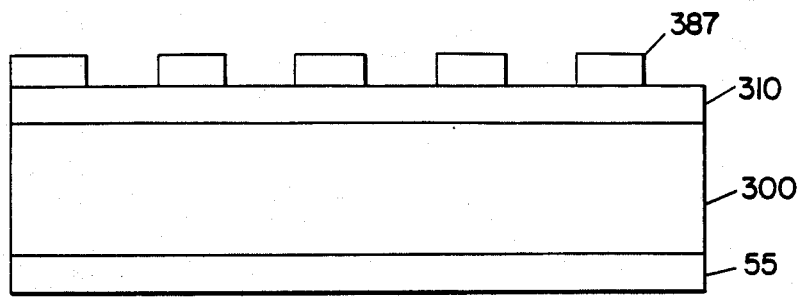
FIG. 5 is a cross-sectional view of a third embodiment of an amorphous silicon device.

In FIG. 5 is shown a cell of the Schottky barrier type. For its fabrication, either glow discharge device herein described may be used. If the device 5 shown is used, a suitable substrate 55 is placed in the chamber 15. The atmosphere is evacuated and a silicon-containing gas is introduced. When a suitable pressure has been obtained, the power supply 60 and the magnetic means 30 are energized, producing a magnetically oriented deposit 300 about one micron or less in thickness. The cell is then transferred to a state-of-the-art evaporator. A thin layer of a suitable metal having a work function of around 4.5 eV, such as, for example, chromium, rhodium, gold, iridium, platinum or palladium, is deposited to a thickness between 80 to 150 Å to form layer 310. It is also possible to form a multi-layer by depositing, for example, a layer of platinum followed by a layer of silver or gold. An electrode grid 387 is then deposited over the metallic layer 310.

Figure 6:
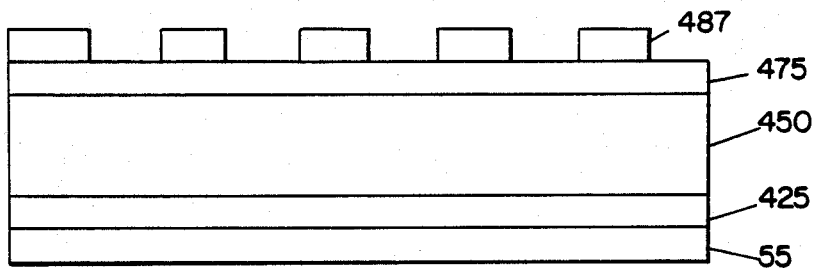
FIG. 6 is a cross-sectional view of a fourth embodiment of an amorphous silicon device.

In FIG. 6 is shown a fourth embodiment of the silicon electronic device, designated a PIN cell. In its fabrication, a doped first layer 425 about one micron or less in thickness is deposited on the substrate means 55 by either glow discharge device, but for the sake of discussion, we will refer to the device 5 of FIG. 1. The magnetic means 30 is energized. The chamber 5 is then evacuated and siliconcontaining gas is introduced. Depending on the cell characteristic, the magnetic means 30 can be reversed in polarity, as well as reversing the polarity of the electrode means. An undoped silicon-containing gas is then introduced and an undoped amorphous silicon layer deposited on about one micron or less in thickness, thereby forming intrinsic layer 450. The chamber 15 is again evacuated and a silicon-containing gas, including an opposite dopant type then used in layer 425, is introduced, thereby depositing doped layer 475. Magnetic means 60 may be reversed as well as reversing the polarity of the electrode means. An electrode grid 487 is then deposited, completing the cell.

Figure 7:
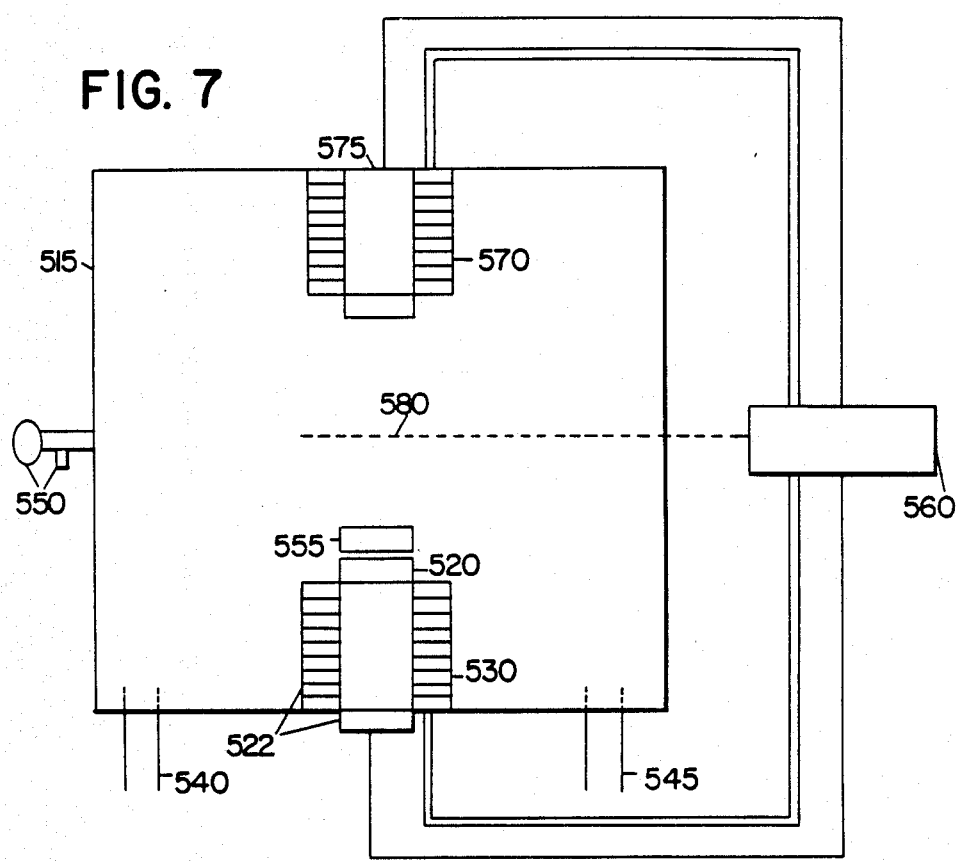
FIG. 7 is a view of a third apparatus for the production of amorphous silicon devices.

Another glow discharge apparatus is shown in FIG. 7. This device is similar to the device shown in FIG. 1 and has components corresponding to the following components of FIG. 1: 40, 22, 62, 45, 30, 20, 50, 55, 60, 15 (corresponding components in FIG. 7 are 540, 522, 562, 545, 530, 520, 550, 555, 560 and 515, respectively). The device in FIG. 7 differs from the device in FIG. 1 by addition of second magnetic means 570 and a removable screen electrode 580, and the omission of the electrode means 34. The operation of the device in FIG. 7 is identical to the devices in FIGS. 1 and 3, except that when the magnetic means 530 is energized, the magnetic means 570 is also energized but with opposite polarity to 530. This helps to further concentrate the ionic process. When the polarity of magnetic means 530 is reversed, the polarity of magnetic means 570 is likewise reversed, allowing the magnets to always be of opposite polarities. However, for certain cell configurations, it may be desirable to have the magnetic polarities the same for both magnets. The removable electrode means 580 allows the device in FIG. 7 to function in the mode shown in FIG. 1 or FIG. 3.

Figure 8:
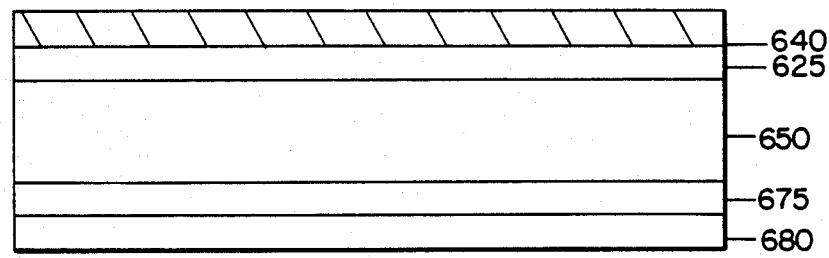
FIG. 8 is a cross-sectional view of a fifth embodiment of an amorphous silicon device.

Referring to FIG. 8, a fifth embodiment of the present invention is shown. Again, the device is a silicon electronic device such as, for example, a photovoltaic cell and, more particularly, a PN junction device. The cell in FIG. 8 comprises a first doped layer 625 of one conductivity type in contact with a second doped layer 650 of opposite conductivity type, creating a junction region therebetween.

For the purposes of discussion, the first layer 625 is of P-type conductivity with the second layer 650 N-type. A third layer 675 is of the same conductivity type as the second layer 650, but contains a higher dopant concentration. The third layer 675 helps in making a better electric contact with layer 650. Completing the cell is a metal electrode lower contact means 680 and a transparent electrode upper contact means 640.

The fabrication of the device in FIG. 8 can be accomplished by the apparatus of FIG. 3 or FIG. 7. For the purpose of discussion, we will use the device in FIG. 3. A glass material with a coating such as, for example, indium tin oxide 640 is placed on the heating means 120. The vacuum chamber means is then evacuated and the heating means 120 is energized, heating the substrate to between 150°–600° C. A silicon-containing gas, including a dopant such as, for example, about 0.05 to 7% diborane, is introduced to a pressure of between 0.05 and 150 torr. The power supply means then energizes the high voltage electrodes 100 and 134 and the magnetic means 130 for about 0.001 to two seconds, producing the magnetically aligned layer 625. The chamber is then re-evacuated and a silicon-containing gas including between 0.001 and 0.5 percent phosphine is introduced. The polarity of the electrode means 100 and 134 and magnetic means 130 may be reversed when forming the layer 650.

Next, an additional quantity of a dopant such as, for example, phosphine is introduced into the chamber means 115 so that there is between 0.75 and 5% of phosphine. The electrode means 134 and 100 and the magnetic means 130 are energized, thereby producing layer 675. Completing the cell, an electrode means 680 is deposited by state-of-the-art metal evaporation procedures and equipment.

Figure 9:
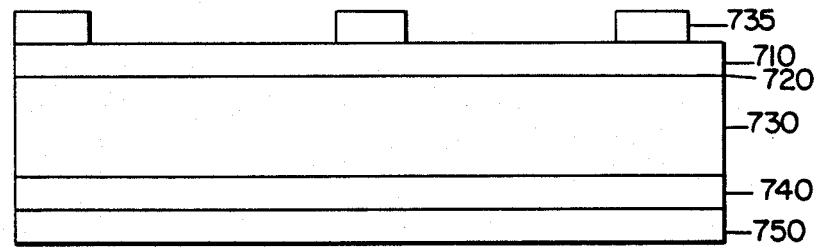
FIG. 9 is a cross-sectional view of a sixth embodiment of an amorphous silicon device.

Referring to FIG. 9, a sixth embodiment of the present invention is shown. More particularly, the device is a heterojunction device. The device in FIG. 9 consists of a semiconductor region 710 comprised of a material such as, for example, crystalline silicon, tin oxide, gallium arsenide, etc. The semiconductor region 710 has a high band gap in order to be transparent to incoming solar radiation, and is highly doped. It is important and well known to those in the art that it is necessary to have a large barrier at the heterojunction 720 in order to promote a large voltage. The barrier 720 results from the correct matching of the band structure of 710 to that of 730. The region 730 consists of a different semiconductive material such as, for example, magnetically aligned amorphous silicon. Region 740 is in intimate contact with region 730. Region 740 may consist of a layer of doped germanium or doped amorphous silicon. This layer is fabricated using glow discharge and magnetic alignment techniques herein described. The region 740 is of the same conductivity type as the region 730, but at a higher level.

Completing the cell, contacts 750 and 735 are deposited by conventional deposition means.

While all the present cell embodiments function well, a coating of an anti-reflecting coating improves efficiency.

While all the herein mentioned cells are described as photovoltaic devices, it will be obvious to those skilled in the art that the devices herein described will also find wide utility as electronic switching devices, rectifiers, or photodetectors, with minor modifications.

While the invention has been herein shown and described in what is presently conceived to be the most practical and preferred embodiments thereof, it will be apparent to those of ordinary skill in the art that many modifications may be made thereof within the scope of the invention, which scope is to be accorded the broadest interpretation of the appended claims so as to encompass all equivalent structures and devices.

I claim:

1. A semiconductor device comprising:
   (a) a substrate;
   (b) a first semiconductor layer formed on said substrate, said first semiconductor layer being formed by deposition in a glow discharge in the presence of a magnetic field perpendicular to the substrate surface on which the first semiconductor layer is formed; and
   (c) a second semiconductor layer formed on said first semiconductor layer, said second semiconductor layer being formed by deposition in a glow discharge in the presence of a magnetic field which is reversed in polarity from the magnetic field used in forming the first semiconductor layer.

2. A semiconductor device according to claim 1, further comprising an electrically conducting grid on said second semiconductor layer.

3. A semiconductor device according to claim 1, wherein the material of the first and second semiconductor layers deposited in a glow discharge in the presence of magnetic fields is selected from the group consisting of amorphous silicon, germanium, cadmium sulfide, cadmium telluride, indium phosphide, gallium arsenide, and aluminum antimonide.

4. A semiconductor device according to claim 3, wherein the material of the first and second semiconductor layers is amorphous silicon.

5. A semiconductor device according to claim 1, wherein the first and second semiconductor layers have dopants incorporated therein.

6. A semiconductor device according to claim 1, wherein the first semiconductor layer is deposited with a first orientation and the second semiconductor layer is deposited with a second orientation different from said first orientation, whereby an electrostatic barrier is formed between said first and second semiconductor layer.

7. A semiconductor device according to claim 6, wherein said first semiconductor layer with a first orientation is formed of molecules in alignment along a common vector with a common rotation, and said second semiconductor layer with a second orientation different from said first orientation is formed of molecules aligned with a different vector than said common vector and with a different rotation than said common rotation, said second semiconductor layer being formed of molecules aligned with an opposite vector to said common vector and with a reverse rotation to said common rotation.

8. A semiconductor device according to claim 7, wherein at least one of said first and second semiconductor layers does not contain a dopant.

9. A method of producing a semiconductor device, comprising the steps of:
(a) forming a first semiconductor layer on a substrate by glow discharge deposition of a semiconductor material, from a gas for depositing said material, in the presence of a first magnetic field, the first magnetic field being perpendicular to the substrate surface on which the first semiconductor layer is formed; and
(b) forming a second semiconductor layer on said first semiconductor layer by glow discharge deposition of a semiconductor material, from a gas for depositing said material, in the presence of a second magnetic field, said second magnetic field being of reversed polarity to that of the first magnetic field.

10. A method according to claim 9, comprising the further step of forming an electrically conducting grid on said second semiconductor layer.

11. A method according to claim 9, wherein said first and second semiconductor layers are made of amorphous silicon as the semiconductor material.

12. A method according to claim 11, wherein the gas for depositing the semiconductor material is selected from the group consisting of silane, silicon tetrafluoride, and silicon gases containing arsenic or selenium.

13. A method according to claim 12, wherein the gas for depositing the semiconductor material is $SiH_4$.

14. A method according to claim 9, wherein the first semiconductor layer is formed to have a first orientation, and the second semiconductor layer is formed to have a second orientation different from said first orientation, whereby an electro-static barrier is created between said first and second semiconductor layers.

15. Silicon photovoltaic device comprising:
(a) a substrate comprising an electrically conductive material;
(b) a first semiconductor layer formed on said substrate, said first semiconductor layer being formed by deposition of amorphous silicon in a glow discharge in the presence of a magnetic field, the magnetic field being perpendicular to the substrate surface on which the first semiconductor layer is formed;
(c) a second semiconductor layer formed on said first semiconductor layer, said second semiconductor layer being formed by deposition of amorphous silicon in a glow discharge in the presence of a magnetic field which is reversed in polarity from the magnetic field used in forming the first semiconductor layer; and
(d) an electrically conducting grid on said second semiconductor layer.

* * * * *